Feb. 6, 1968 A. HERLET ET AL 3,368,121

SEMICONDUCTOR THYRISTOR OF PNPN TYPE

Filed Sept. 1, 1965 2 Sheets-Sheet 1

Feb. 6, 1968 A. HERLET ETAL 3,368,121

SEMICONDUCTOR THYRISTOR OF PNPN TYPE

Filed Sept. 1, 1965 2 Sheets-Sheet 2

3,368,121

SEMICONDUCTOR THYRISTOR OF PNPN TYPE

Adolf Herlet, Pretzfeld, and Hubert Patalong, Ebermannstadt, Germany, assignors to Siemens-Schuckertwerke Aktiengesellschaft, Berlin, Germany, a corporation of Germany Filed Sept. 1, 1965, Ser. No. 484,228
Claims priority, application Germany, Sept. 12, 1964, S 93,127
5 Claims. (Cl. 317—234)

ABSTRACT OF THE DISCLOSURE

A semiconductor thyristor includes a monocrystalline flat semiconductor body. The semiconductor body has a substantially planar surface and four zones of alternately different conductivity type forming a PN junction between adjacent ones of the zones. The zones include a pair of outer zones and a pair of inner zones. A first contact electrode is in electrical contact with the planar surface of the semiconductor body in one of the outer zones. A second contact electrode is in electrical contact with the planar surface of the semiconductor body in one of the inner zones adjacent to the one of the outer zones. Each of the contact electrodes has a surface. A pair of electrode leads each has a contact surface positioned in electrical contact with the surface of a corresponding one of the contact electrodes. The contact surface of the corresponding one of the electrode leads extends over the peripheral edge of the first contact electrode toward the second contact electrode.

The present invention relates to a semiconductor thyristor of PNPN type. More particularly, the invention relates to a silicon thyristor of PNPN type.

A semiconductor thyristor of PNPN type is known as a semiconductor controller rectifier and generally comprises a substantially monocrystalline semiconductor body having four sequentially adjacent zones of alternately opposite conductivity type. The two outer zones are usually known as emitters and the two inner zones are usually known as bases. In a semiconductor thyristor, the monocrystalline semiconductor body comprises a flat disc having an outer zone on each of its two substantially planar sides, each outer zone having a contact electrode, and the contact electrode of the inner zone, which functions as the ignition electrode, positioned in an area formed and surrounded by one of the outer zones and its contact electrode. The inner and outer zones are positioned in adjacent laminar or sandwich configuration. The ignition electrode is positioned in contact with the corresponding inner zone and functions to supply a curent through the PN junction between the inner zone contacted by said ignition electrode and the adjacent outer zone. The current supplied by the ignition electrode determines the conductive or non-conductive condition of the thyristor. A thyristor of the type described is disclosed in an article entitled "The Silicon Thyristor BSt L 02" by Herlet, Raithel and Spenke in the April 1963 issue of the Siemens company publication, pages 291 to 294.

The principal object of the present invention is to provide a new and improved semiconductor thyristor of PNPN type.

An object of the present invention is to provide a semiconductor thyristor having an improved thermal stress characteristic.

Another object of the present invention is to provide a semiconductor thyristor having a rapid current rise characteristic.

Another object of the present invention is to provide a semiconductor thyristor having an even flow of current throughout the entire emitter cross-section.

In accordance with the present invention, a semi-conductor thyristor includes a body of silicon having a substantially planar surface and a contact electrode of substantially annular configuration in electrical contact with the surface of the silicon body and an ignition electrode in electrical contact with the surface of the silicon body in the area formed and surrounded by the contact electrode and spaced from the contact electrode, each of the electrodes having a surface. A pair of electrode leads each has a contact surface positioned in electrical contact with the surface of a corresponding one of the electrodes and overlapping the surface of the corresponding one of the electrodes. The contact surface of one of the electrode leads overlaps the surface of the contact electrode in a partially annular area by approximately 0.5 mm. in radial direction and has a rounded off lower peripheral edge bounding its contact surface. The contact surface of the other of the electrode leads overlaps the surface of the ignition electrode in an annular rim area by approximately 0.5 mm. in radial direction.

In order that the present invention may be readily carried into effect, it will now be described with reference to the accompanying drawings, wherein.

In the figures, the same components are identified by the same reference numerals.

Figure 1:
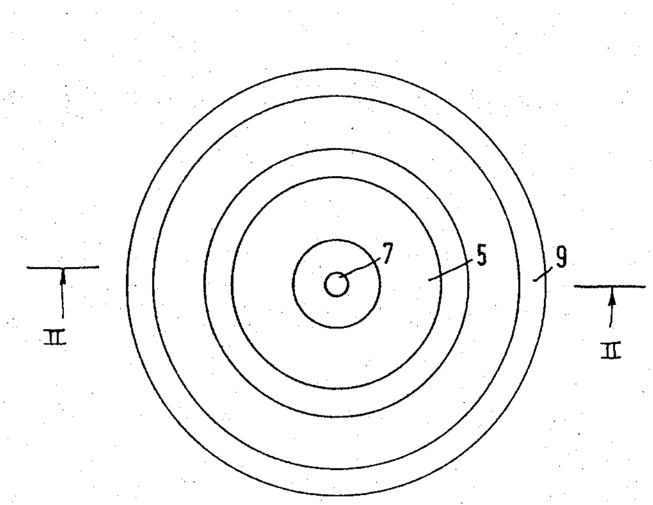
Fig.1 Prior Art
FIG. 1 is a top view of a semiconductor thyristor without electrode leads.

In the figures, a semiconductor disc 2 comprises monocrystalline silicon of N conductivity type. The disc 2 has two substantially planar surfaces and is approximately 300 microns thick. The silicon body 2 has a specific resistance of approximately 20 to 30 ohm-cm. The disc 2 is provided with a surface layer 3 of P conductivity type having a depth of approximately 70 microns.

The surface layer 3 may be provided by indiffusion of the body 2 by a material which produces P conductivity. A suitable material may comprise, for example, aluminum, gallium and/or boron. The layer 3 may be produced, for example, by heating the silicon disc 2 to approximately 1230° C. in an evacuated quartz vessel, in the presence of aluminum. The aluminum is also maintained at this temperature. The duration of the treatment may be about 35 hours. Semiconductor discs having a diameter of about 10 to 35 mm. such as, for example, 18 mm., may be used. A ring shaped or annular groove, channel or recess may be etched or milled into the upper surface of the semiconductor disc 2. The depth of the disc 2 of the annular groove at each spot exceeds the thickness of the indiffused layer 3 of P conductivity type, so that a round disc shaped layer 4 of P conductivity type is formed on the body 2. The provision of the P conductivity layers 3 and 4 on the planar surfaces of the semiconductor disc 2 may include the removal of part of the peripheral rim of the unit 2, 3, 4. The entire rim may be etched, ground off, or removed by sand blasts to provide a sloping rim as illustrated in FIG. 2.

Gold foil containing about 0.5 antimony in round disc configuration is alloyed into the layer 4 of P conductivity type. During cooling from the alloying temperature, the gold foil forms an electrode 5 and a zone 6 of N conductivity type adjacent said electrode. A PN junction is thus provided between the layer 4 and the zone 6. A disc-shaped electrode 7, which serves as an ignition electrode, is alloyed into the layer 4 in the area formed and surrounded by the zone 6 and the electrode 5. The ignition electrode 7 may comprise, for example, gold foil containing about 0.05% boron. The electrode 7 contacts the layer 4, without blocking.

The layers 2 and 4 constitute the two inner zones or bases of the thyristor; the layer 4 being contacted by the contact electrode 7. The layers 3 and 6 constitute the two outer zones or emitters of the thyristor. The layer or zone 3 of P conductivity type is contacted without blocking by an alloyed electrode 8. The composition of the electrode 8 may be the same as that of the ignition electrode 7. The electrodes 5, 7 and 8, produced of gold foil having a thickness of approximately 30 to 50 microns, may be alloyed in during the same working operation, at approximately 700° C. If necessary, the individual zones may also be contacted with other materials. Thus, for example, the zone 3, may be contacted by applied aluminum foil which is then alloyed in at a higher temperature such as, for example, 750° C. A carrier plate or body 9 comprising, for example, molybdenum having a thickness of approximately 2 mm., may be alloyed in simultaneously with the electrode 8.

Figure 2:
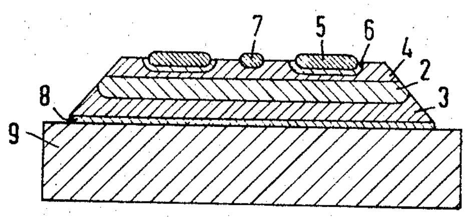
Fig.2 Prior Art
FIG. 2 is a sectional view of the thyristor of FIG. 1 taken along the lines II—II.
Figure 3:
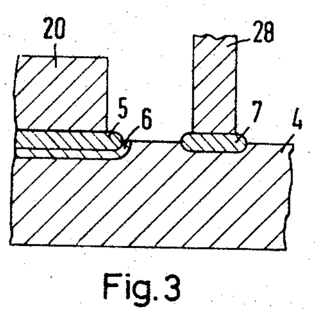
Fig.3 Prior Art
FIG. 3 is a sectional view of part of the thyristor of FIGS. 1 and 2 with electrode leads.

FIG. 3 is an illustration, on an enlarged scale, of part of the thyristor of FIGS. 1 and 2 with electrode leads. The electrode leads or terminal parts supply current to the contact electrodes. An electrode lead or terminal part 20 supplies current to the contact electrode 5 and an electrode lead or terminal part 28 supplies current to the contact electrode 7. The electrode leads 20 and 28 may be alloyed to their corresponding contact electrodes, or they may be positioned on their contact electrodes by solder free noble metal pressure contacts. FIG. 3 illustrates the customary structure of electrode leads and contact electrodes for current supplies.

Each electrode lead 20 and 28 has a cross-sectional area at its contact surface with its corresponding contact electrode which is smaller than the available contact area of said contact electrode. This difference in contact area leaves an open or uncovered rim area of the contact electrode in the form of an annular area around the electrode lead. The uncovered rim area of the surface of each contact electrode around its corresponding electrode lead is open to etching and other undesirable abrading or other effect. Furthermore, considerable thermal stress is engendered due to the fact that during a sudden current increase, the exposed or open rim of the contact electrode is not sufficiently cooled. The metal electrode leads or terminal parts 20 and 28 serve, simultaneously, for heat dissipation and/or distribution.

If a current is supplied through the ignition electrode 7, the PN junction between the outer and inner zones 6 and 4 is at first made passable only at the rim of the area around and adjacent to the ignition electrode 7. The ignition current branches out or flows from this area at relatively high speed over the entire area of the PN junction. The time required for such current flow is small, but is large enough so that the curent flow between contact electrode 5 and the contact electrode 8 first occurs across the part of the contact electrode 5 which is adjacent to the ignition electrode 7. If, due to components or parts of the circuit which includes the thyristor, for example, there is a very rapid increase of current in accordance with time, the current density at the rim of the contact electrode 5 may become too high for adequate heat dissipation. If this occurs, the PN junction in the area of the rim of the contact electrode 5 is destroyed.

Figure 4:
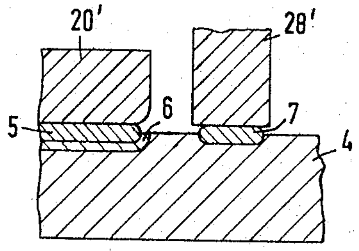
FIG. 4 is a sectional view of part of an embodiment of a thyristor of the present invention.

FIG. 4 illustrates an embodiment of the thyristor of the present invention, showing the part of the thyristor including the contact electrodes 5 and 7 and the electrode leads or terminal parts 20′ and 28′ on an enlarged scale. In accordance with the present invention, each of the electrode leads or terminal parts 20′ and 28′ has a cross-sectional area at its contact surface with its corresponding contact electrode which is larger in width than the contacting area of said contact electrode. Thus, the electrode lead 20′ extends over the contact electrode 5 in a partially annular rim area of said electrode lead and thereby covers and overlaps said contact electrode in width, and the electrode lead 28′ extends over the contact electrode, which is the ignition electrode, in an annular rim area of said electrode lead and thereby entirely covers and overlaps said ignition electrode. Each of the electrode leads 20′ and 28′ extends approximately 0.5 mm. in overlap beyond its corresponding contact electrode in radial direction. Thus, each of the contact electrodes 5 and 7 is provided with the advantages of full heat dissipation by its corresponding electrode lead. This is especially advantageous in dissipating heat from the contact electrode 5 via the electrode lead 20′. The heat dissipating or distributing capacity of the electrode leads 20′ and 28′ is so great that PN junction breakdown is prevented even if the current increases very rapidly.

In accordance with the present invention, the thyristor has an improved and even current flow throughout its emitter cross-section and a rapid current rise characteristic, as well as an improved thermal stress characteristic due to improved heat dissipation or distribution.

The parts of the semiconductor thyristor, as shown in the figures, are greatly distorted, especially with regard to their thicknesses. The thickness of the contact electrode 5 is, for example, from 40 to 80 microns and the thickness of the zone 6 is between 10 and 50 microns. The electrode lead 20′ has a diameter or thickness, which may be the same as that of the carrier plate 9, of from 1 to 3 mm. The contact electrodes 5 and 7 may be spaced a distance of from 0.8 to 1.5 mm. from each other.

The electrode lead or terminal part 28′ is of lesser importance than the electrode lead 20′, since it serves only to supply the ignition current, which has a relatively small current intensity, such as, for example, 1 ampere at a permeability current of 100 to 600 amperes. However, the electrode lead 28′ is still preferably made to overlap the corresponding contact or ignition electrode 7, as described.

The lower peripheral edge of the electrode lead 20′ is preferably rounded off, as shown in FIG. 4. This aids in preventing great field intensities, which may cause permeability of the short path between the electrode lead 20′ and the layer or zone 2.

Figure 5:
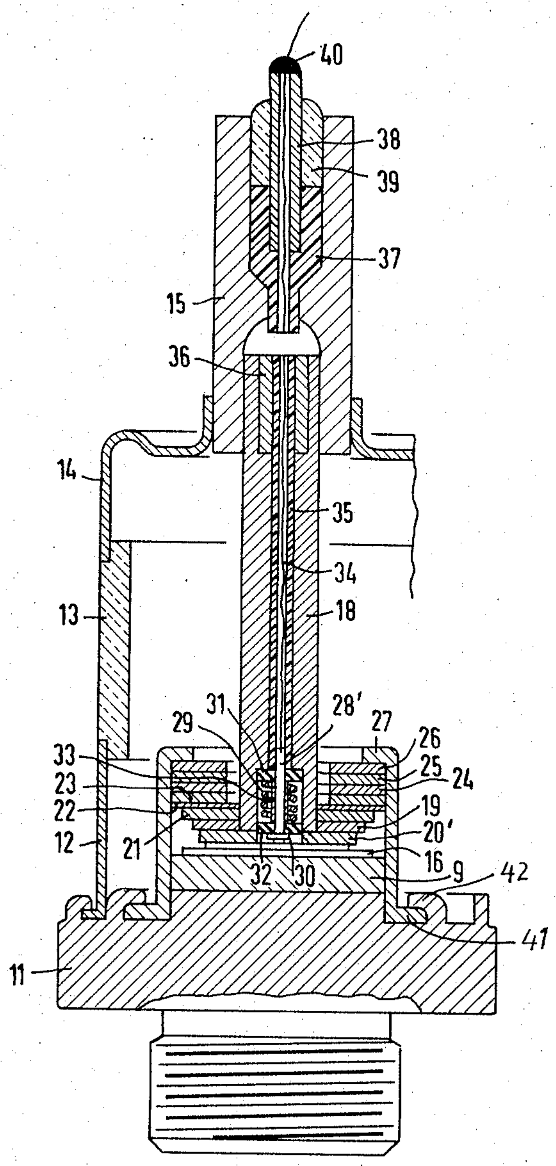
Fig. 5 Prior Art
FIG. 5 is a view, partly in section, of a housing for a semiconductor thyristor.

FIG. 5 illustrates a housing for the thyristor of the present invention. The housing of FIG. 5 comprises a bottom portion 11 and a bell shaped upper portion of combined components 12 to 15. The bottom part 11 may, for example, comprise a heat sink and may comprise, for example, copper. The components 12 and 14 preferably comprise an iron-nickel-cobalt alloy such as, for example, Fernico, Vacon or Kovar. A cylindrical ceramic component 13 insulates the components 12 and 14 from each other. The component 13 is metallized at the points at which it contacts the components 12 and 14. This permits the components 12 and 14 to be soldered to the ceramic component 13.

The bell-shaped upper portion may be connected with the bottom portion by means of flanging or bending over a protruding rim of the bottom portion. The component 15 may also comprise copper and may be connected to the component 14 by solder or by a weld. A semiconductor thyristor 16 of the type of the present invention is supported on or connected with the carrier plate 9, which may comprise molybdenum or tungsten, by means of alloying, for example. If necessary, intermediate layers may be provided between the contact electrode 8 (FIG. 2) and the carrier plate 9 to facilitate the alloying process. The intermediate layer may comprise, for example, silver plating or the like. The carrier plate 9 rests upon a raised portion of the bottom portion 11. The lower surface of the carrier plate 9 is preferably plated with a noble metal such as, for example, silver or silver foil about 100 microns thick.

The connection between the bottom portion 11 and the carrier plate 9 may be achieved in accordance with the teachings of pending patent application, Ser. No. 220,336, now Patent No. 3,280,385. The contacting surfaces are lapped prior to being joined and the lapping process is performed in a manner whereby the surfaces acquire a roughness depth of from 0.5 to 50 microns, preferably between 1 and 3 microns. Following the lapping process, each of the two contact areas is even to such a high degree that the bilateral deviations of the central surface from a geometric plane is no greater than the roughness depth. One of the two surfaces may also be polished. However, care must be taken that arching of the surface, which usually results from polishing, does not lead to a greater deviation of the central surface from a geometric plane. However, at least one of the two contacting surfaces must have the described roughness.

A hollow, cylinder-shaped current supply arrangement is seated upon the surface of the semiconductor thyristor 16 and comprises a plurality of component parts. The current supply arrangement is positioned in electrical contact with the annular or ring-shaped contact electrode 5 of the thyristor. The current supply arrangement comprises a tubular copper portion 18, a copper ring or washer 19 and an annular ring or washer 20′, which may comprise molybdenum and which functions as one of the electrode leads of the thyristor. The component parts 18, 19 and 20′ are preferably connected with each other by hard solder. The molybdenum electrode lead or terminal part 20′ is preferably plated with silver on its contact surface which contacts the contact electrode 5 of the thyristor. The aforedescribed process for joining the carrier plate with the bottom portion 11 may be utilized to join the electrode lead 20′ to the contact electrode 5 of the thyristor.

A ring or washer 21 comprising, for example, steel, a mica washer 22 for the purpose of insulation and centering, an additional steel washer 23, and three cup springs 24, 25 and 26, complete the structure to a bell-shaped holder portion 27 which covers the aforementioned components. The bell-shaped holder portion 27 has an outwardly extending flange 41 at its base. The flange 41 of the bell-shaped holder portion 27 may be covered or clamped by an overlapping flange 42 of the bottom portion 11 to hold said holder portion in position. The holder portion 27 may, of course, be affixed to the bottom portion 11 in any suitable manner such as, for example, by welding or bolting. The component 12 may be affixed to the bottom portion 11 in any suitable manner.

A central bore or conduit formed through the component 18 is widened at its lower portion so that a shoulder is produced within said component. Another electrode lead or terminal part 28′ of the thyristor may comprise, for example, a copper pin, and is positioned in electrical contact with the contact electrode 7 (shown in FIG. 4) of the thyristor, which electrode functions as the ignition electrode. The contact surface of the electrode lead 28′, which electrically contacts the surface of the contact electrode 7, is preferably silver plated and levelled by the aforementioned, or any suitable, lapping process. A coil spring 29 applies pressure to the electrode lead 28′ and urges said electrode lead against the contact electrode 7. The coil spring 29 abuts at its upper end against the shoulder formed by the conduit inside the current supply component 18. The lower end of the coil spring 29 abuts a washer 30, which is rigidly affixed to the electrode lead 28′.

An insulating washer 31 is positioned above the spring 29 and an insulating washer 32 is positioned below said spring. Each of the insulating washers 31 and 32 may comprise, for example Teflon. A sleeve 33 of electrical insulation covers the electrode lead 28′ between said lead and the coil spring 29 and is flexible. An electrical conductor 34 comprising, for example, a silver wire, is electrically connected to the upper end of the electrode lead 28′ and is extended through the bore through the component 18. A sleeve 35 of electrical insulation such as, for example, silicon rubber, covers the wire 34 and insulates it from the component 18. A steel sleeve 36 is inserted in the bore or conduit at the upper end of the component 18, to prevent said component from being crushed during the joining of the component 15 to said component and to protect the insulation 35 inside said component.

During the assembly of the housing of FIG. 5, it is preferable to position the components 21 to 27 on the component parts 18, 19 and 20′. The components 28 to 36 are then positioned inside the current supply arrangement comprising the component parts 18, 19 and 20′. The assembly is then positioned upon the thyristor, which has been positioned on the bottom portion 11. The holder portion 27 is then affixed to the bottom portion 11 to provide a rigid assembly of the aforementioned components. The components 12 to 15 are then affixed to the bottom portion 11, and the components 15 and 18 are affixed to each other by compression.

The upper part of the wire 34 is insulated from the component 15 by electrical insulating material 37. The insulation 37 preferably comprises Teflon. A hollow metal sleeve 38 comprising, for example, silver, is inserted into the insulating material 37. The space between the component 15 and the hollow cylinder 38 is filled with a casting resin 39 and thereby is sealed vacuum-tight. A solder drop 40 serves to completely seal off the inside area of the housing against the atmosphere.

While the invention has been described by means of a specific example and in a specific embodiment, we do not wish to be limited thereto, for obvious modifications will occur to those skilled in the art without departing from the spirit and scope of the invention.

We claim:

1. In a semiconductor thyristor including a monocrystalline flat semiconductor body having a substantially planar surface and four zones of alternately different conductivity type forming a p-n junction between adjacent ones of said zones, said zones including a pair of outer zones and a pair of inner zones, a first contact electrode in electrical contact with the planar surface of said semiconductor body in one of said outer zones and second contact electrode in electrical contact with the planar surface of said semiconductor body in one of said inner zones adjacent to said one of said outer zones, each of said contact electrodes having a surface, a pair of electrode leads each having a contact surface positioned in electrical contact with the surface of a corresponding one of said contact electrodes, the contact surface of the corresponding one of said electrode leads extending over the peripheral edge of said first contact electrode toward said second contact electrode.

2. In a semiconductor thyristor as claimed in claim 1, wherein the contact surface of said electrode lead extending over the peripheral edge of said first contact electrode overlaps the surface of said contact electrode in an annular rim area.

3. In a semiconductor thyristor as claimed in claim 1, wherein the contact surface of said electrode lead extending over the peripheral edge of said first contact electrode overlaps the surface of said contact electrode by approximately 0.5 mm. in radial direction.

4. In a semiconductor thyristor as claimed in claim 1, further comprising a pressure contact for providing electrical contact between the contact surface of said electrode lead and the surface of said first contact electrode, said pressure contact comprising a noble metal having zero solder.

5. In a semiconductor thyristor as claimed in claim 1, wherein said electrode lead extending over the peripheral edge of said first contact electrode has a rounded off lower peripheral edge bounding the contact surface thereof.

References Cited

UNITED STATES PATENTS

| | | | |
|---|---|---|---|
| 3,081,418 | 3/1963 | Manintveld et al. | 317—235 |
| 3,200,310 | 8/1965 | Carman | 317—235 |

JOHN W. HUCKERT, *Primary Examiner.*

J. D. CRAIG, *Assistant Examiner.*